United States Patent [19]
Havemann

[11] Patent Number: 4,706,378
[45] Date of Patent: Nov. 17, 1987

[54] METHOD OF MAKING VERTICAL BIPOLAR TRANSISTOR HAVING BASE ABOVE BURIED NITRIDE DIELECTRIC FORMED BY DEEP IMPLANTATION

[75] Inventor: Robert H. Havemann, Garland, Tex.

[73] Assignee: Texas Instruments Incorporated, Dallas, Tex.

[21] Appl. No.: 716,296

[22] Filed: Mar. 26, 1985

Related U.S. Application Data

[63] Continuation-in-part of Ser. No. 696,378, Jan. 30, 1985, abandoned.

[51] Int. Cl.$^4$ .................. H01L 21/265; H01L 21/20
[52] U.S. Cl. ........................ 437/24; 148/DIG. 10; 148/DIG. 82; 148/DIG. 77; 357/51; 357/91; 357/34; 437/26; 437/31; 437/33
[58] Field of Search ............... 29/571, 576 B, 576 T; 148/1.5, 187; 357/91, 51, 34

[56] References Cited

U.S. PATENT DOCUMENTS

| 3,622,382 | 11/1971 | Brack et al. | 148/1.5 |
| 4,190,949 | 3/1980 | Ikeda et al. | 29/571 |
| 4,317,686 | 3/1982 | Anand et al. | 148/1.5 |
| 4,412,868 | 11/1983 | Brown et al. | 148/1.5 |
| 4,490,182 | 12/1984 | Scovell | 148/1.5 |

OTHER PUBLICATIONS

Maeyama et al., Jap. Jour. Appl. Phys., 21 (1982) 744.
Gill, S., Radiation Effects Letts., 85 (1984) 67.
Hemment et al., Vacuum, 34 (1984) 203.
Kim et al., J. Electrochem. Soc., 131 (1984) 1934.
Arienzo et al., IBM-TDB, vol. 27 (Sep. 1984) 2371.

Primary Examiner—Upendra Roy
Attorney, Agent, or Firm—Leo N. Heiting; James T. Comfort; Douglas A. Sorensen

[57] ABSTRACT

In one embodiment of a vertical bipolar transistor constructed in accordance with the teachings of this invention, oxygen is implanted into the vertical bipolar transistor to provide a silicon dioxide layer between the base and collector of the vertical bipolar transistor. This silicon dioxide layer reduces the actual interface area of the base to collector junction, thereby decreasing the capacitance of the base-collector junction. In addition, the dielectric constant of the silicon dioxide layer is such that the capacitance across the silicon dioxide layer, and thus between the base and collector, is minimal relative to the base to collector capacitance provided by the base to collector junction itself. In an alternative embodiment, nitrogen is implanted to form silicon nitride regions rather than silicon dioxide regions.

22 Claims, 13 Drawing Figures

METHOD OF MAKING VERTICAL BIPOLAR TRANSISTOR HAVING BASE ABOVE BURIED NITRIDE DIELECTRIC FORMED BY DEEP IMPLANTATION

CROSS-REFERENCE TO RELATED APPLICATION

This application is a continuation-in-part of copending application Ser. No. 696,378 filed Jan. 30, 1985 now abandoned.

FIELD OF THE INVENTION

The present invention relates to the field of integrated circuit fabrication. Specifically, the present invention relates to a structure and method for fabricating bipolar transistors.

BACKGROUND OF THE INVENTION

One of the properties which inhibits the high frequency and high speed digital operation of bipolar transistors is the capacitive coupling between the base and the emitter and the base and the collector of the bipolar transistor. The capacitive coupling occurs across the depletion regions of the respective junctions. This phenomenon is well known and is explained in Sze, PHYSICS OF SEMICONDUCTOR DEVICES, pp. 79–81(1981). Because the base to emitter junction controls the current flow of the transistor, most transistors are fabricated so that the base to emitter junction has a minimum of interface area. The interface area is that region of the base and emitter which are in contact with each other. Using a simple parallel plate capacitor model, the equation for the capacitance of a junction is $$C = k60A/d$$

where,
C is the capacitance of the junction,
k is the dielectric constant of the material between the "plates" of the capacitor,
60 is the permitivity of free space,
A is the area of the "plates", and
d is the width of the junction depletion region.

Thus the capacitance of a junction is directly proportional to the area of the junction and is inversely proportional to the width of the junction depletion region. Thus there are three ways of decreasing the capacitance of a junction: decreasing the dielectric constant of the junction material or a portion of the the junction, decreasing the area of the junction and increasing the thickness of the junction. Because the active junction must consist of the semiconductor material which forms the bipolar transistor, it is usually impractical to change the dielectric constant of the overall junction (active and parasitic) in a bipolar transistor. Therefore, in order to reduce the capacitance of a junction the active junction area must be decreased, the effective junction thickness must be increased and/or the dielectric constant of the parasitic junction regions must be decreased.

FIG. 1 is a side view of a prior art vertical bipolar transistor. Buried collector 3 is formed in substrate 1. An N-type epitaxial layer is formed on substrate 1 and isolation oxide regions 2 are formed in this epitaxial layer. Base region 5 is formed on epitaxial layer 4 and emitter region 6 is formed in base region 5. Contact diffusion 9 allows base contact 8 to make ohmic contact. Emitter contact 7 contacts emitter region 6 directly. In this structure, and in most vertical bipolar transistors, the base to emitter interface area is much less than the base-collector interface area. Therefore by reducing the base to collector capacitance, the overall parasitic capacitance of a vertical bipolar transistor may be minimized. Therefore, it is an object of the present invention to minimize the base to collector capacitance of a vertical bipolar transistor.

SUMMARY

In one embodiment of a vertical bipolar transistor constructed in accordance with the teachings of this invention, oxygen is implanted into the vertical bipolar transistor to provide a silicon dioxide layer between the parasitic extrinsic base region and collector of the vertical bipolar transistor. This silicon dioxide layer reduces the actual interface area of the base to collector junction, thereby decreasing the capacitance of the base collector junction. In addition, the thickness and dielectric constant of the silicon dioxide layer is such that the capacitance across the silicon dioxide layer, and thus between the base and collector, is minimal relative to the base to collector capacitance provided by the base to collector junction itself, because the dielectric constant of silicon dioxide is approximately 3.9 (which is much less than the dielectric constant of crystalline silicon which is approximately 11.7). In another embodiment, nitrogen ions are implanted to form silicon nitride regions rather than silicon dioxide regions.

DETAILED DESCRIPTION

Figure 1:
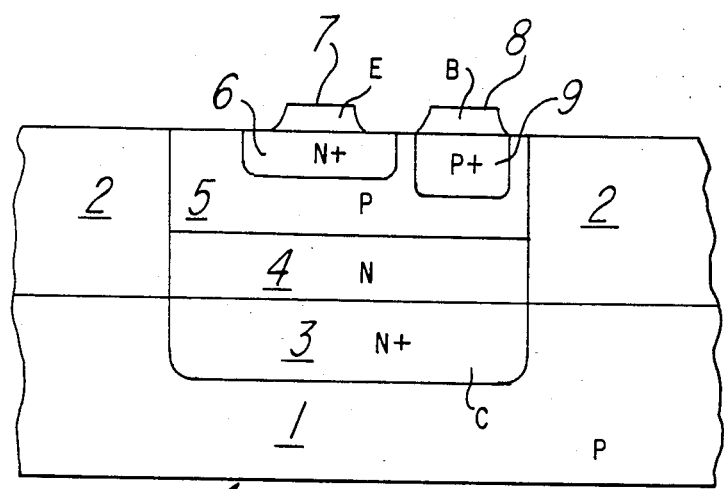
FIG. 1 is a schematic side view showing the construction of a prior art vertical bipolar transistor.
Figure 2A:
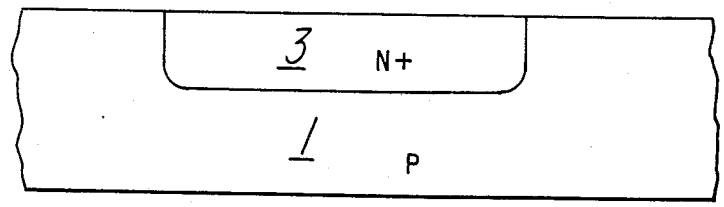
FIGS. 2A–2H are schematic side view drawings depicting the processing steps necessary to construct one embodiment of the present invention.
Figure 2B:
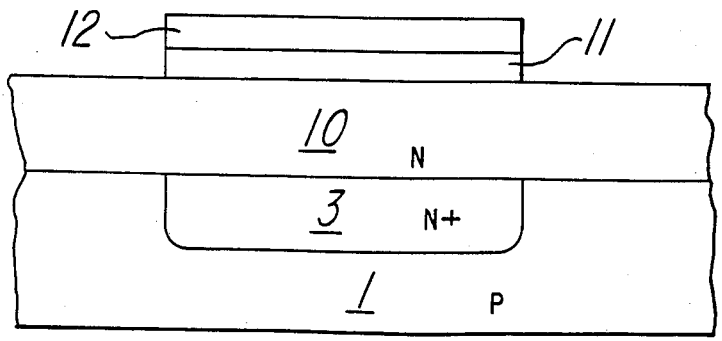
Figure 2C:
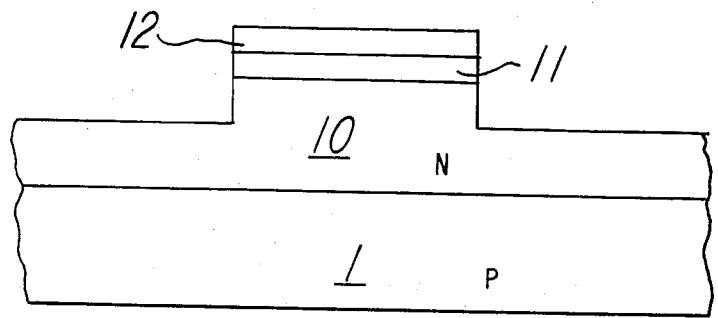
Figure 2D:
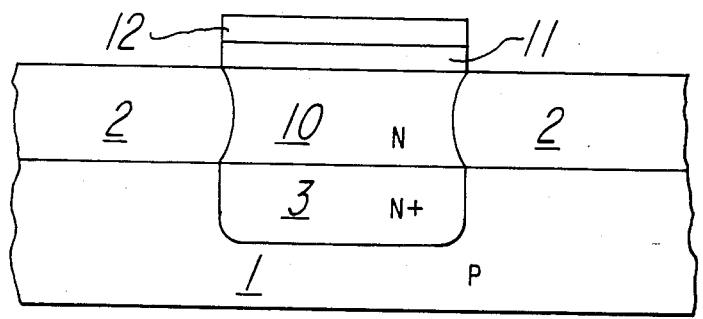
Figure 2E:
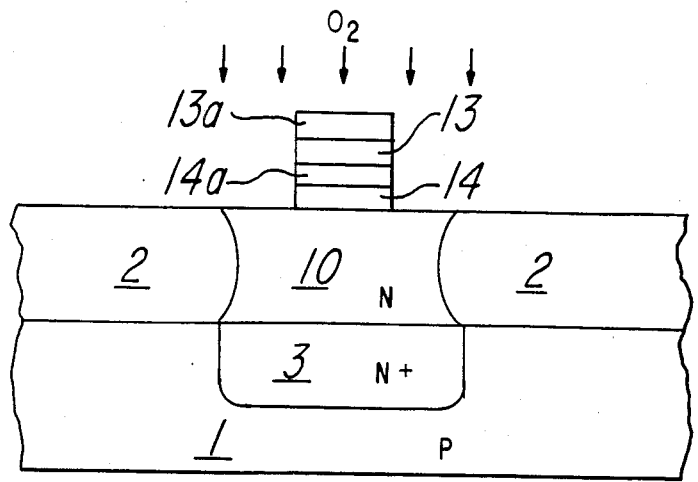

FIGS. 2A–2H are schematic side view drawings showing the processing steps necessary to produce a vertical bipolar transistor with reduced base to collector capacitance in accordance with one embodiment of the present invention. Diffusion region 3 of FIG. 2A is an N+ diffusion formed in P-type substrate 1 using techniques well known in the art. Silicon epitaxial layer 10 of FIG. 2B is formed on the surface of substrate 1 to a thickness of approximately 1 micron using techniques well known in the art. Silicon dioxide layer 11 and silicon nitride layer 12 are formed and patterned on the surface of epitaxial layer 10 using techniques well known in the art. Epitaxial layer 10 is then anisotropically etched to provide the structure shown in FIG. 2C. Silicon dioxide layers 2 of FIG. 2D are then thermally grown in an steam ambient at a temperature of approximately 975 degrees C. for approximately 8 hours. Silicon nitride layer 12 and silicon dioxide layer 11 are then removed using techniques well known in the art. Silicon dioxide layer 14 is then thermally grown in an oxygen ambient at a temperature of 950 degrees C. for approximately 30 minutes to a thickness of approximately 300 angstroms. Polycrystalline silicon layer 14A is then formed by chemical vapor deposition to a thickness of approximately 2,000 angstroms. Silicon nitride layer 13 is then formed to a thickness of approximately 2,000 angstroms using chemical vapor deposition. Silicon dioxide layer 13A is then deposited by chemical vapor deposition or plasma deposition to a thickness of 6,000 to 8,000 angstroms. Silicon dioxide layer 14, silicon dioxide layer 13A, polycrystalline silicon layer 14a and silicon nitride layer 13 are then patterned and anisotropically etched using techniques well known in the art. Epitaxial layer 10 is then subjected to an ion implantation of oxygen ions(O2) at an energy of approximately 300 kiloelectron volts and a density of 6E17 ions per centimeter squared. After this oxygen implant, silicon dioxide layer 13A is removed by wet etching in dilute 10% hydrofluoric acid which selectively etches undensified silicon dioxide layer 13A without significantly undercutting silicon dioxide layer 14. The oxygen implant will have no effect on isolation regions 2 and, after annealing at approximately 1150 degrees C. for approximately two hours, will form silicon dioxide regions 15 of FIG. 2F which are approximately 4000 angstroms below the surface of epitaxial layer 10.

In a preferred embodiment, epitaxial layer 10 is implanted with nitrogen ions(N2) rather than oxygen ions. These nitrogen ions are implanted at an energy of approximately 150 to 200 kiloelectron-volts and a density of approximately 5E17 to 1.5E18 ions per centimeter squared to form silicon nitride regions approximately 4000 angstroms below the surface of silicon epitaxial layer 10. When annealed, these implanted ions will form silicon nitride regions instead of silicon dioxide regions 15 of FIG. 3B. Experimental evidence has shown that implanted nitrogen used to form buried insulator layers produces fewer defects in the crystal structure of epitaxial layer 10. The subsequent processing steps for this embodiment are the same as for the embodiment using implanted oxygen ions.

Returning to the embodiment including implanted oxygen ions, protective silicon dioxide layer 15A is then thermally grown on the exposed surfaces of epitaxial layer 10 to a thickness of approximately 1500 angstroms.

Figure 2F:
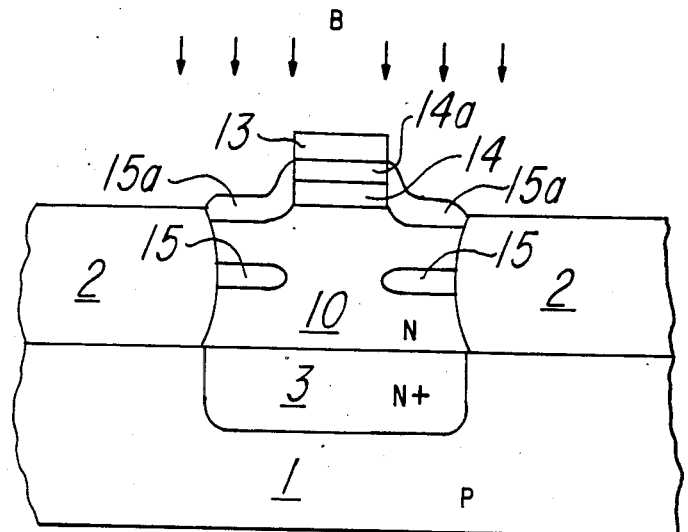
Figure 2G:
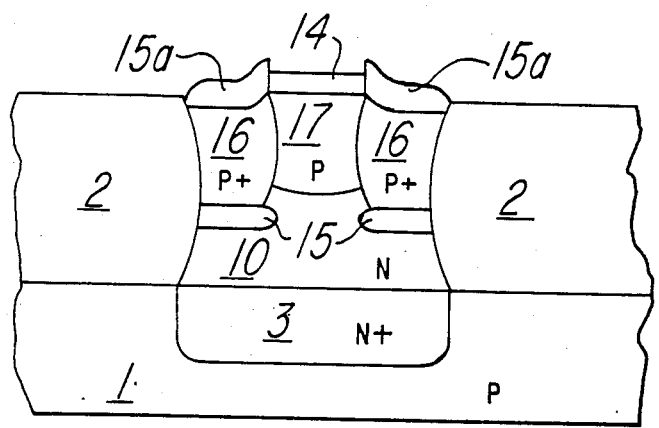
Figure 2H:
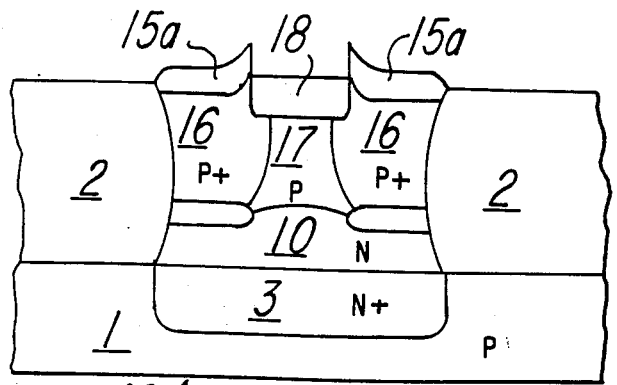

The structure of FIG. 2F is then subjected to a boron ion implantation having an energy of approximately 50 kiloelectron volts and a density of approximately 1E15 ions per centimeter squared. Silicon nitride layer 13 is then removed using a solution of phosphoric acid. Polycrystalline silicon layer 14A is then removed by selective wet etching or by selective plasma etching in, for example, a carbon tetrafluoride-oxygen plasma. A second boron implantation is then performed at an energy of of approximately 50 to 70 kiloelectron volts and at a density of approximately 1E13 to 1E14 ions per centimeter squared. These boron ion implantations are then driven in to form P+ regions 16 and P region 17 of FIG. 2G thus forming a base region on silicon dioxide regions 15 providing a base-on-insulator structure. Silicon dioxide layer 14 is removed by wet etching in a 10% hydrafluoric acid solution such that a substantial portion of silicon dioxide layers 15A remain. N+ region 18 is then formed in the surface of epitaxial layer 10 by implanting an appropriate dopant ion such as phosphorous or arsenic ions to yield the structure of FIG. 2H. Contacts (not shown) are then made to collector diffusion 3 and extrinsic base regions 6 by techniques well known in the art. This structure limits the parasitic capacitance between the base and the collector by decreasing the dielectric constant at the extrinsic base-collector junction.

Figure 3A:
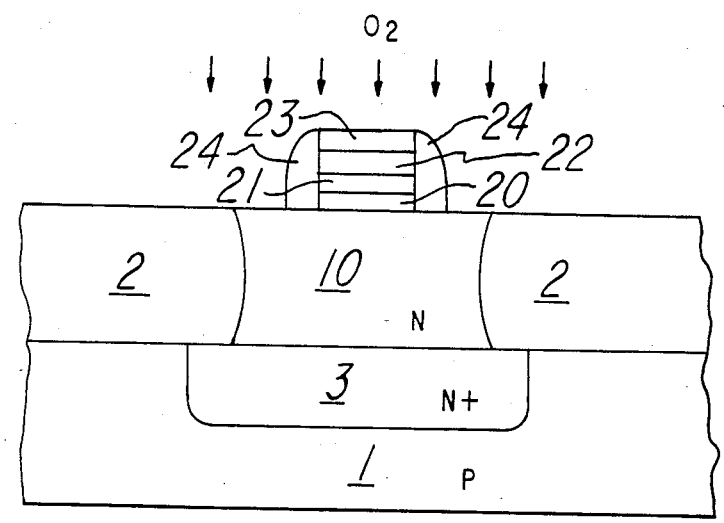
FIGS. 3A–3D are schematic side view drawings depicting the processing steps necessary to fabricate another embodiment of the present invention.

FIGS. 3A through 3D are side view schematic diagrams depicting the processing steps necessary to form another embodiment of the present invention. This embodiment provides a similar self-aligned process but provides a polycrystalline silicon emitter structure. Polycrystalline silicon layer 20 is formed by low pressure chemical vapor deposition to a thickness of approximately 2000 angstroms. Silicondioxide region 21 is thermally grown to a thickness of approximately 300 angstroms. Silicon nitride layer 22 is formed by low pressure chemical vapor deposition to a thickness of 2000 to 3000 angstroms. Silicon dioxide layer 23 is formed by plasma or chemical vapor deposition to a thickness of approximately 6000 to 8000 angstroms. These layers are then patterned and anisotropically etched using techniques well known in the art to provide the structure shown in FIG. 3A. A layer of silicon dioxide (not shown) approximately 3000 angstroms thick is then deposited by low pressure chemical vapor deposition on the surface of epitaxial layer 10. The silicon dioxide layer (not shown) is then anisotropically etched to form sidewall oxide layers 24. The structure of FIG. 3A is then subjected to an implant of oxygen ions (O2) at an energy of approximately 300 kiloelectron volts and a density of approximately 6E17 atoms per centimeter squared. This ion implantation is annealed to provide slicon dioxide regions 15 of FIG. 3B. Sidewall oxide layers 24 and plasma oxide layer 22 are then selectively etched using 10% dilute hydroflouric.

In a preferred embodiment, the structure of FIG. 3A is implanted with nitrogen ions (N2) rather than oxygen ions. These nitrogen ions are implanted at an energy of approximately 150 to 200 kiloelectron-volts and a density of approximately 5E17 to 1.5E18 ions per centimeter squared to form silicon nitride regions approximately 4000 angstroms below the surface of epitaxial layer 10. When annealed, these implanted ions will form silicon nitride regions instead of silicon dioxide regions 15 of FIG. 3B. Experimental evidence has shown that implanted nitrogen used to form buried insulator layers produces fewer defects in the crystal structure of epitaxial layer 10. The subsequent processing steps for this embodiment are the same for the embodiment using implanted oxygen ions.

Figure 3B:
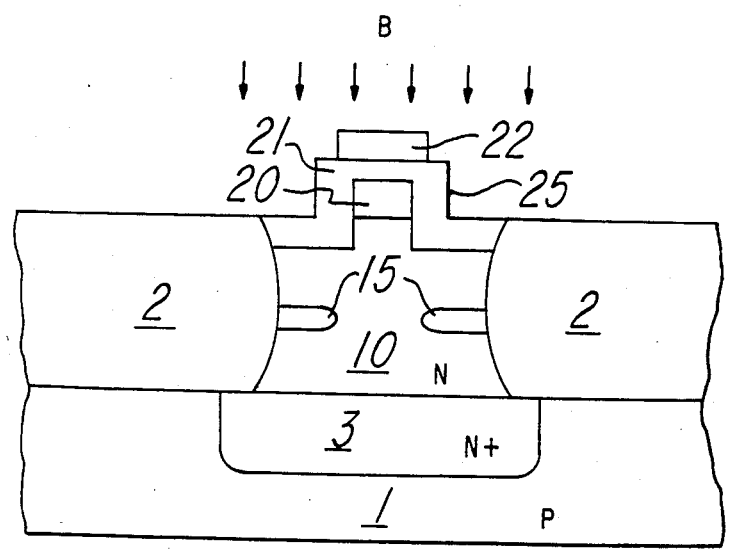

Returning to the embodiment using implanted oxygen, silicon dioxide layer 25 is then formed by thermal oxidation to a thickness of approximately 1500 angstroms. Of importance, silicon dioxide layer 21 has a thickness of 300 angstroms which is much less than the thickness of silicon dioxide layer 25. The structure of FIG. 3B is then subjected to a boron ion implantation having an energy of approximately 70 kiloelectron volts and at a density of approximately 1E15 ions per centimeter squared. Silicon nitride layer 22 (FIG. 3B) is removed using an etching process which selectively removes silicon nitride while not etching silicon dioxide, such as wet etching in phosphoric acid. Silicon dioxide layer 21 is then removed by wet etching in a solution of 10% dilute hydrofluoric acid. The etching period is selected so as to be sufficient to remove oxide layer 21 but leave a substantial portion of silicon dioxide layer 25. Thus polycrystalline silicon region 20 is exposed.

Figure 3C:
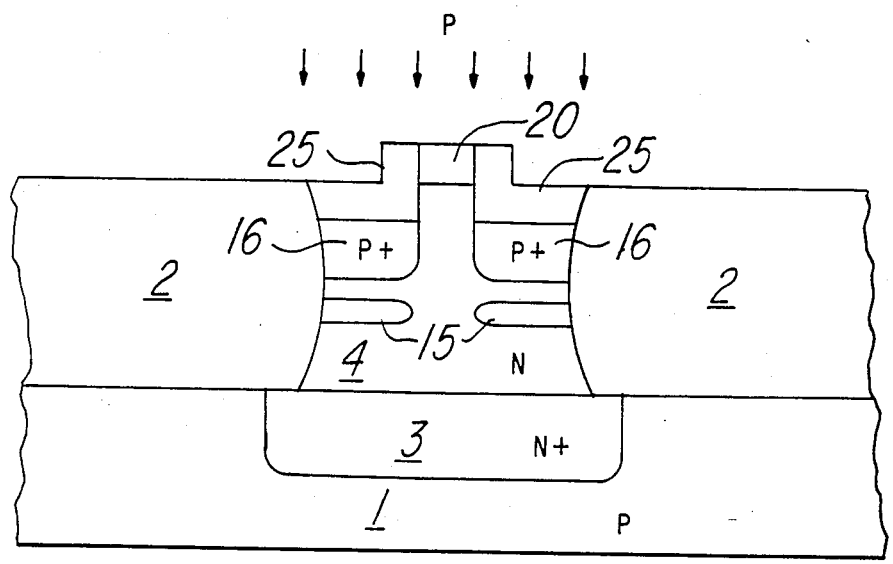
Figure 3D:
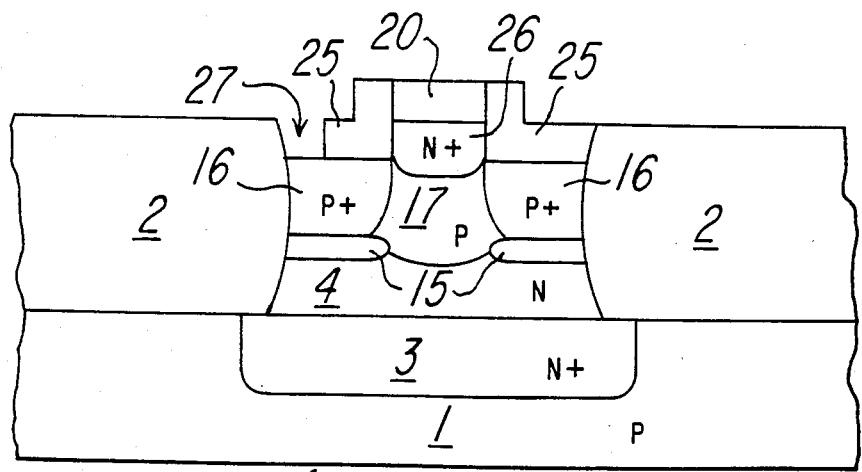

The structure of FIG. 3C is subjected to an implant of N type dopant ions such as arsenic ions having an energy of approximately 50 kiloelectron volts and a density of approximately 1E15 to 1E16 ions per centimeter squared. This ion implantation is annealed to provide a very shallow N+ emitter region 26 of FIG. 3D and also drives in P+ regions 16. In addition, the ion implantation heavily dopes polycrystalline silicon region 20 to lower the resistivity of polycrystalline silicon region 20 to a negligible value. An ion implantation of boron ions is then performed at an energy of approximately 140 kiloelectron-volts and a density of approximately 1E13 to 1E14 ions per centimeter squared and annealled to provide base region 17. Base contact 27 opening is etched in silicon dioxide region 25 using techniques well known in the art. A contact (now shown) is also made to collector diffusion 3 by techniques well known in the art.

Thus transistor 50 is formed with silicon dioxide regions 15 using a self-aligned process. Silicon dioxide regions 15 reduce the capacitance of the base to collector junction for the reasons stated here and before.

TECHNICAL ADVANTAGES

The present invention provides the technical advantage of reducing the base to collector capacitance of vertical bipolar transistors. This reduction in capacitance allows vertical bipolar transistors constructed according to the teachings of this invention operate at increased frequency and to operate at increased speed when used in digital electronic circuits.

We claim:

1. A process for fabricating a vertical pipolar transistor with a base-on-insulator structure, comprising the steps of:
   providing a substrate including a buried layer of a first conductivity type which serves as the collector of said transistor:
   providing a masking layer over said substrate to expose only a portion thereof, and implanting nitrogen atoms into said substrate where exposed by said masking layer to selected depth which is shallower than the depth of the uppermost portion of said buried layer to react with said substrate to form insulator regions:
   implanting dopant ions of a second conductivity type into said substrate to form a base region at a depth such that portions of said insulator regions formed by said nitrogen implanting step lie under said base region: and
   implanting ions of said first type into said substrate to form an emitter region.

2. A process as in claim 1 wherein said first conductivity type is N and said second conductivity type is P.

3. A process as in claim 1 wherein said substrate is crystalline silicon.

4. A method for fabricating a bipolar transistor, comprising the steps of:
   (a) providing a substrate, said substrate having a semiconducting subcollector region heavily doped with a first conductivity type at at least one surface portion thereof:
   (b) growing an epitaxial layer over said substrate in a location such that said subcollector region becomes a buried diffusion, such that said subcollector region becomes a buried diffusion, and forming at least one mesa from said epitaxial laver over at least part of said subcollector region:
   (c) providing a masking layer over said mesa to expose only a portion thereof, and implanting into said mesa where exposed by said masking layer ions selected from the group consisting of oxygen and nitrogen at high energy at high area dosage, and annealing said implant to form buried regions of lowered dielectric constant at a selected depth which is shallower than the uppermost portion of said subcollector region:
   (d) implanting into portions of said mesa above said buried regions of lowered dielectric constant a second-type dopant to form a heavily doped extrinsic base-region and implanting into portions of said mesa which are not above said buried regions of lowered dielectric constant a second-type dopant to form an intrinsic base region which is less heavily doped than said extrinsic base region, and forming above said intrinsic base region an emitter region which is heavily doped with said first conductivity type:
   (e) wherein portions of said epitaxial layer between said subcollector and said intrinsic base are of said first conductivity type (after all of said implanting and annealing steps) to define a collector region.

5. The method of claim 4, wherein said high area dosage is in the neighborhood of 6E17 cm$^{-2}$.

6. The method of claim 4, wherein said high energy is in the neighborhood of 300 keV.

7. The method of claim 4, wherein said epitaxial layer is deposited with said second conductivity type.

8. The method of claim 4, wherein said first conductivity type is n-type.

9. The method of claim 4, wherein said step of forming said mesa comprises etching portions of said epitaxial layer and then forming a delectric surrounding said mesa.

10. The method of claim 4, wherein said step of forming said mesa comprises etching portions of said epitaxial layer and then growing an oxide to form a delectric surrounding said mesa.

11. The method of claim 4, further comprising the subsequent step of:
    (f) making electrical contact to said extrinsic base region.

12. The method of claim 4, wherein said extrinsic base region is formed by implantation into approximately the same exposed locations as said step of implanting ions to form regions of reduced dielectric constant.

13. The method of claim 4, wherein said step of implanting to form said extrinsic base region uses portions of the same masking layer which was used to mask said step of implanting ions to form regions of reduced dielectric constant.

14. The method of claim 4, wherein said emitter region is formed by implanting a large dose of dopants of said first conductivity type into said mesa.

15. A method for fabricating a bipolar transistor, comprising the steps of:
    (a) providing a substrate, said substrate including a collector region doped, with a first conductivity type and a subcollector region underlying at least a portion of the collector region and doped with said first conductivity type to a higher concentration than said collector region:
    (b) providing a masking layer on said substrate above only a portion of said collector region, and implanting at high energy and at high area dosage, into areas exposed by said masking layer, ions selected from the group consisting of oxygen and nitrogen, and annealing said implant to form buried regions of lowered dielectric constant which are shallower than at least some uppermost portions of said subcollector region; and (c) implanting into semiconductor regions above said buried regions of lowered dielectric constant a second-type dopant to form a heavily doped extrinsic base region, and implanting a second-type dopant, into other semiconductor portions of which had been covered by said masking layer during said step of implanting to form buried regions of lowered dielectric constant, to form an intrinsic base region which is less heavily doped than said extrinsic base region, and forming above said intrinsic base region an emitter region which is heavily doped with said first conductivity type.

16. The method of claim 15 wherein said high area dosage is in the neighborhood of 6E17 cm$^{-2}$.

17. The method of claim 15, wherein said high energy is in the neighborhood of 300 keV.

18. The method of claim 15, wherein said first conductivity type is n-type.

19. The method of claim 15, further comprising the subsequent step of:
(d) making electrical contact to said extrinsic base region.

20. The method of claim 15, wherein said extrinsic base region is formed by implantation into approximately the same exposed locations as said step of implanting ions to form regions of reduced dielectric constant.

21. The method of claim 15, wherein said step of implanting to form said extrinsic base region uses portions of the same masking layer which was used to mask said step of implanting ions to form regions of reduced dielectric constant.

22. The method of claim 15, wherein said emitter region is formed by implanting a large dose of dopants of said first conductivity type.

* * * * *